United States Patent
Tsau

(10) Patent No.: US 7,329,955 B2
(45) Date of Patent: Feb. 12, 2008

(54) METAL-INSULATOR-METAL (MIM) CAPACITOR

(75) Inventor: Liming Tsau, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/365,922

(22) Filed: Mar. 2, 2006

(65) Prior Publication Data

US 2006/0145295 A1    Jul. 6, 2006

Related U.S. Application Data

(63) Continuation of application No. 10/750,834, filed on Jan. 5, 2004, now Pat. No. 7,049,204, which is a continuation of application No. 09/753,664, filed on Jan. 4, 2001, now Pat. No. 6,803,306.

(51) Int. Cl.
*H01L 23/48*    (2006.01)

(52) U.S. Cl. .............. 257/758; 257/E21.579; 438/957

(58) Field of Classification Search ............ 257/301, 257/306, 532, 758, 759, E21.579; 438/396, 438/622, 957, 397, 637, 638, 723, 724, 687, 438/959
See application file for complete search history.

(56) References Cited

U.S. PATENT DOCUMENTS

| | | | |
|---|---|---|---|
| 5,162,258 A | 11/1992 | Lemnios et al. | |
| 5,792,704 A | 8/1998 | Jun et al. | |
| 5,972,192 A | 10/1999 | Dubin et al. | |
| 5,990,015 A | 11/1999 | Lin et al. | |
| 6,048,762 A | 4/2000 | Hsia et al. | |
| 6,081,021 A | 6/2000 | Gambino et al. | |
| 6,180,976 B1 * | 1/2001 | Roy ........................ 257/306 |
| 6,184,551 B1 | 2/2001 | Lee et al. | |
| 6,225,207 B1 | 5/2001 | Parikh | |
| 6,297,162 B1 | 10/2001 | Jang et al. | |
| 6,320,244 B1 | 11/2001 | Alers et al. | |
| 6,329,234 B1 * | 12/2001 | Ma et al. ................. 438/210 |
| 6,346,454 B1 | 2/2002 | Sung et al. | |

(Continued)

FOREIGN PATENT DOCUMENTS

EP    1073 101 A1    1/2001

(Continued)

OTHER PUBLICATIONS

European Search Report for Appln No. EP 02 52 0004, Sep. 26, 2003 (date of completion of search) 3 pages.

(Continued)

*Primary Examiner*—Lex Malsawma
*Assistant Examiner*—Khiem D Nguyen
(74) *Attorney, Agent, or Firm*—Sterne, Kessler, Goldstein & Fox P.L.L.C.

(57) ABSTRACT

A metal-insulator-metal (MIM) capacitor is made according to a copper dual-damascene process. A first copper or copper alloy metal layer if formed on a substrate. A portion of the first metal layer is utilized as the lower plate of the MIM capacitor. An etch stop dielectric layer is used during etching of subsequent layers. A portion of an etch stop layer is not removed and is utilized as the insulator for the MIM capacitor. A second copper or copper alloy metal layer is later formed on the substrate. A portion of the second metal layer is utilized as the upper plate of the MIM capacitor.

18 Claims, 13 Drawing Sheets

U.S. PATENT DOCUMENTS

| | | | |
|---|---|---|---|
| 6,384,444 B2 * | 5/2002 | Sakoh | 257/303 |
| 6,399,495 B1 * | 6/2002 | Tseng et al. | 438/687 |
| 6,413,815 B1 * | 7/2002 | Lai et al. | 438/243 |
| 6,426,249 B1 * | 7/2002 | Geffken et al. | 438/239 |
| 6,472,124 B1 | 10/2002 | Chung | |
| 6,475,911 B1 | 11/2002 | Lane | |
| 6,479,344 B2 | 11/2002 | Huang et al. | |
| 6,498,364 B1 * | 12/2002 | Downey et al. | 257/303 |
| 6,531,372 B2 | 3/2003 | Lee et al. | |
| 6,569,746 B2 | 5/2003 | Lee et al. | |
| 6,635,523 B1 | 10/2003 | Uchiyama et al. | |
| 6,656,788 B2 | 12/2003 | Park et al. | |
| 6,670,256 B2 | 12/2003 | Yang et al. | |
| 6,759,703 B1 * | 7/2004 | Matsuhashi | 257/306 |
| 6,803,306 B2 | 10/2004 | Tsau | |
| 6,921,689 B2 | 7/2005 | Matsuhashi | |
| 2001/0002722 A1 | 6/2001 | Lee et al. | |
| 2002/0028552 A1 | 3/2002 | Lee et al. | |
| 2002/0113297 A1 | 8/2002 | Voldman et al. | |
| 2004/0248372 A1 | 12/2004 | Tsau | |

FOREIGN PATENT DOCUMENTS

| | | |
|---|---|---|
| WO | WO 00/46844 | 8/2000 |

OTHER PUBLICATIONS

Smith, "Application-Specific Integrated Circuits," 8$^{th}$ Edition, May, 2000, Chapter 4, Programmable *ASICS*, 4.1 The Antifuse, pp. 170-174.

Institute of Microelectriconics, "Deep Submicron—Advanced RFIC Integration," *IME* Strategic Focuses, http://www.ime.org.sg/deep/deep_rfic.htm, Jun. 27, 2002, pp. 1-3.

* cited by examiner (CASE 1 ALL LAYERS)

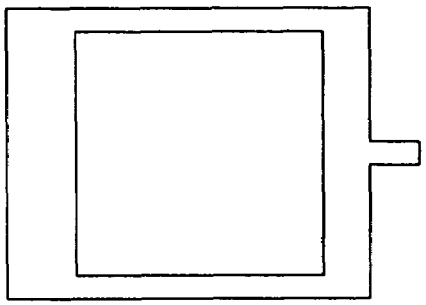
FIG. 16J
(M5 LAYER)
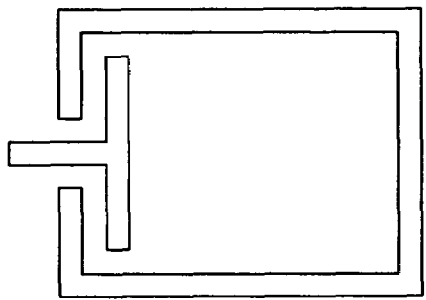
FIG. 16H
(M4 LAYER)
FIG. 16I
(V4 LAYER)
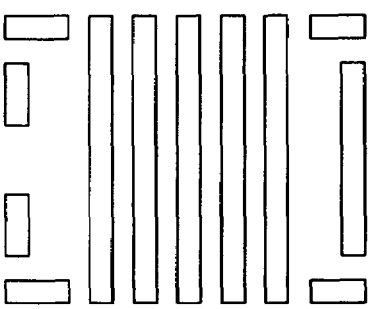
FIG. 16F
(M3 LAYER)
FIG. 16G
(V3 LAYER)
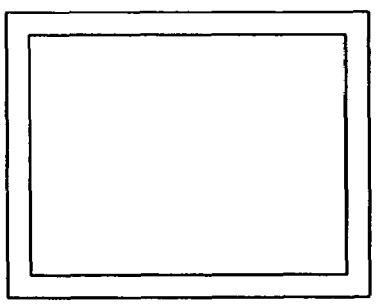
FIG. 16D
(M2 LAYER)
FIG. 16E
(V2 LAYER)
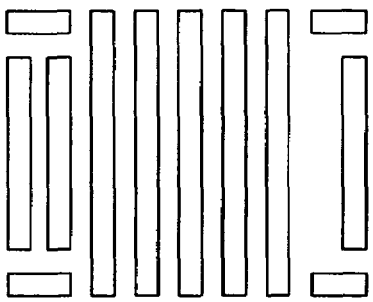
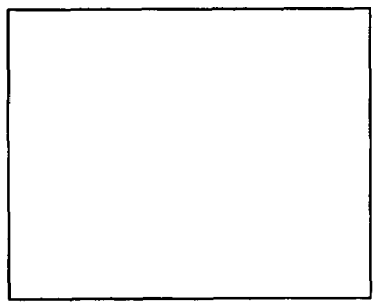
FIG. 16B
(M1 LAYER)
FIG. 16C
(V1 LAYER)
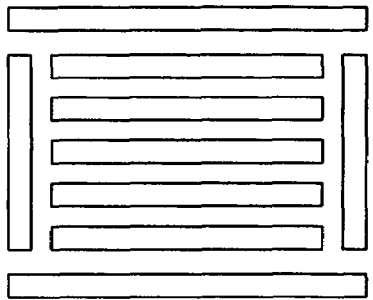

(CASE 2 ALL LAYERS)

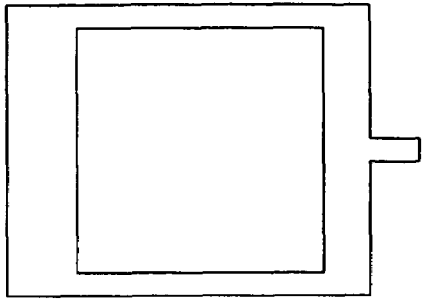
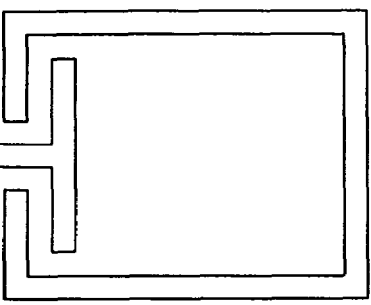
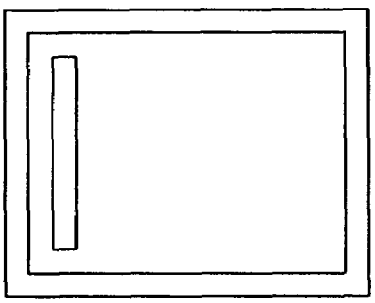
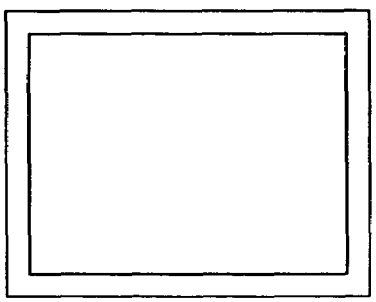
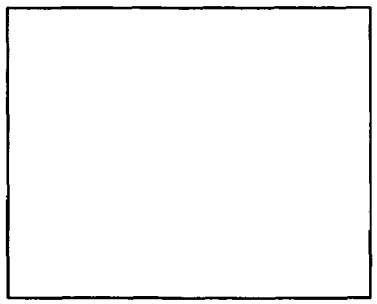
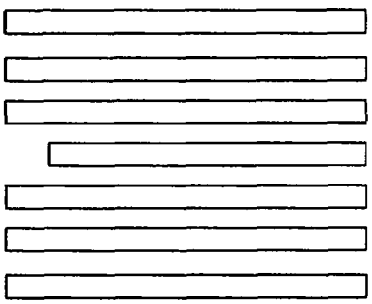
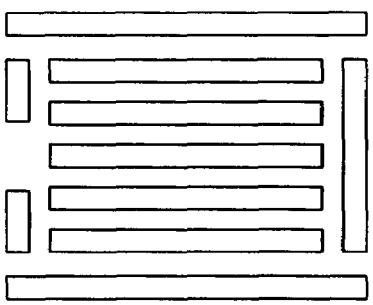
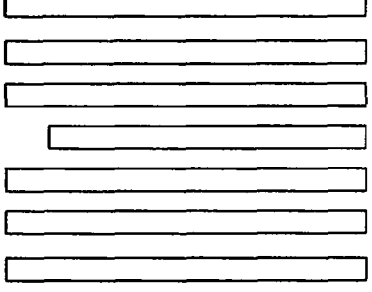
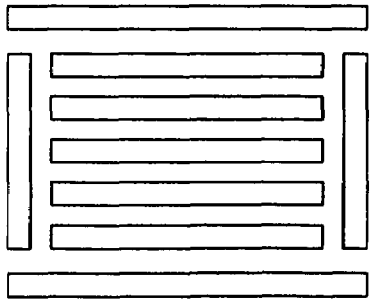

(CASE 3 ALL LAYERS)

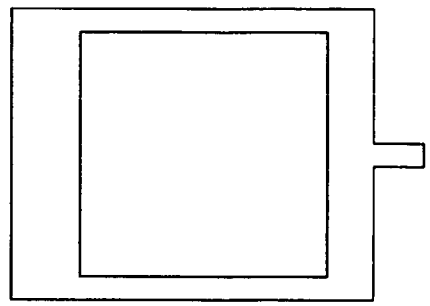
FIG. 18J (M5 LAYER)
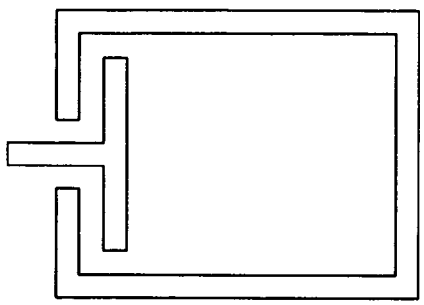
FIG. 18H (M4 LAYER)
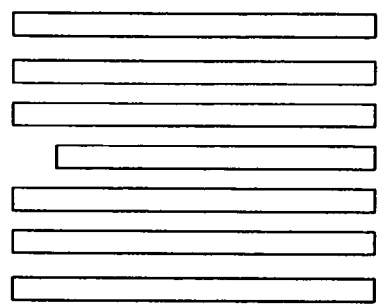
FIG. 18I (V4 LAYER)
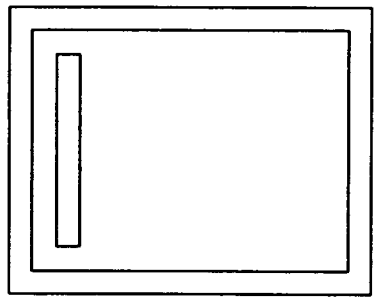
FIG. 18F (M3 LAYER)
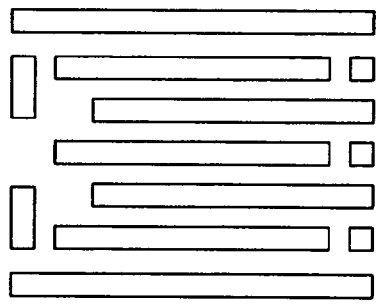
FIG. 18G (V3 LAYER)
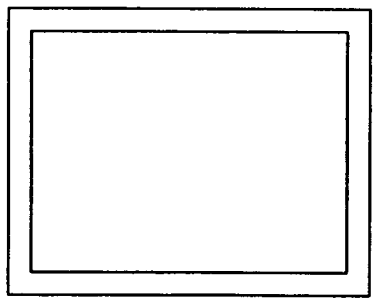
FIG. 18D (M2 LAYER)
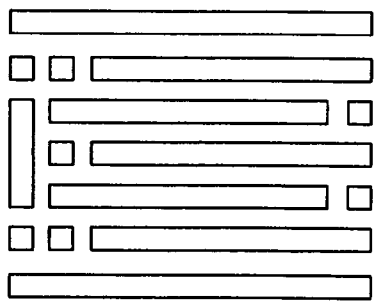
FIG. 18E (V2 LAYER)
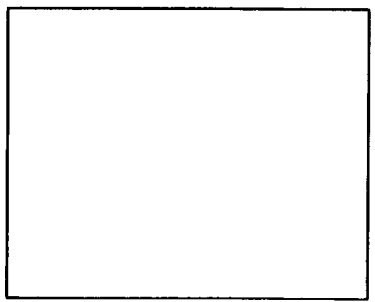
FIG. 18B (M1 LAYER)
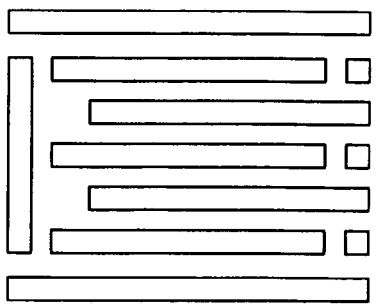
FIG. 18C (V1 LAYER)

(CASE 4 ALL LAYERS)

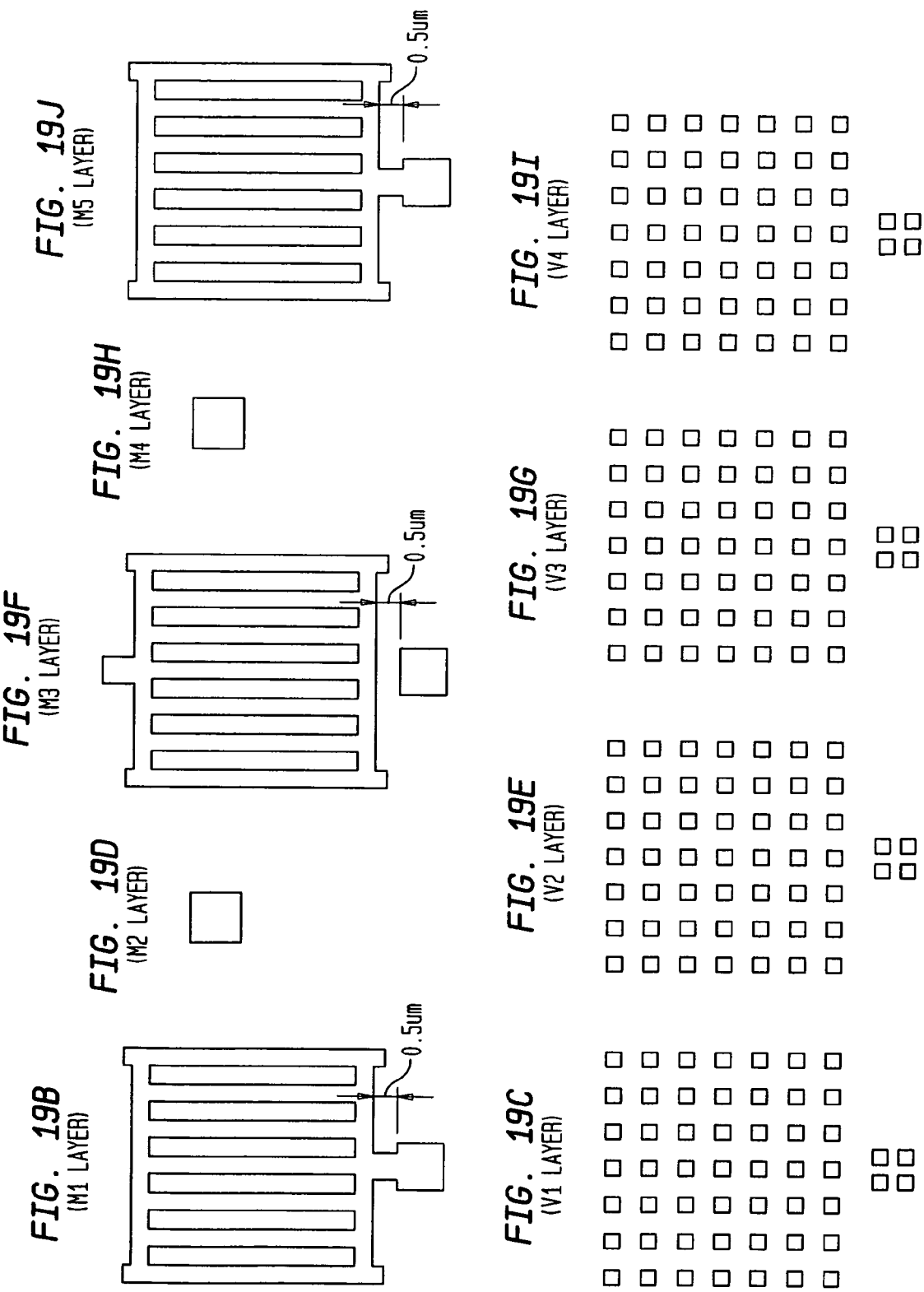

METAL-INSULATOR-METAL (MIM) CAPACITOR

CROSS REFERENCE TO RELATED APPLICATIONS

This application is a continuation of U.S. application Ser. No. 10/750,834, filed Jan. 5, 2004 (now U.S. Pat. No. 7,049,204 that issued May 23, 2006), which is a continuation of U.S. application Ser. No. 09/753,664, filed Jan. 4, 2001 (now U.S. Pat. No. 6,803,306 that issued Oct. 12, 2004), which are both incorporated herein by reference in their entireties.

BACKGROUND OF THE INVENTION

1. Field of the Invention

The present invention relates generally to semiconductor structures and manufacturing. More particularly, the present invention relates to the formation of metal-insulator-metal capacitors.

2. Related Art

Advances in semiconductor manufacturing technology have led to the integration of millions of circuit elements, such as transistors, on a single integrated circuit (IC). In order to integrate increasing numbers of circuit elements onto an IC it has been necessary to reduce the dimensions of the various component parts. Not only have interconnect line widths become smaller, but so have the dimensions of metal-oxide-semiconductor field effect transistors and other integrated devices, such as capacitors.

Metal-electrode capacitors are widely used in mixed-signal/radio frequency (RF) ICs for better linearity and higher Q (quality factor) (due to lower electrode resistance). MIM (metal-insulator-metal) capacitors have been commercially available in the standard CMOS (complimentary metal oxide silicon) mixed-signal process with aluminum interconnect, by adding steps to the process flow. However, similar MIM capacitors are being developed for the most advanced copper interconnects, which is replacing the aluminum interconnects in the 0.15 µm (micrometer=$10^{-6}$) generation and beyond. Due to the uniqueness in the copper damascene process, there is no simple/low-cost way of making MIM capacitors.

What is desired is a method of making copper MIM capacitors using fully compatible CMOS logic process techniques.

SUMMARY OF THE INVENTION

The capacitors made according to the present invention are specially designed for the copper dual-damascene process. These capacitors are fully CMOS logic process compatible. There are no extra process steps required and hence no extra cost.

The invention comprises forming a first copper or copper alloy metal layer in a first dielectric layer over a substrate. An etch stop layer and a second dielectric layer are formed on the first dielectric layer and first metal layer.

A patterned masking layer (known as the via photo resist layer) is formed over the second dielectric layer. The exposed portion of the second dielectric layer is removed, so that a first opening (say, for the capacitor) and a second opening (say, for the via) are formed in the second dielectric layer, thereby exposing portions of the stop layer above a first region and a second region of the first metal layer, respectively.

Another patterned masking layer (known as the metal photo resist layer) is formed such that a further portion of the second dielectric layer and a portion of the stop layer are exposed. The exposed portions of the second dielectric layer and the stop layer are removed, thereby exposing a portion of the second region of the first metal layer. The first and the second openings are filled with a copper or copper alloy thereby forming a second metal layer, wherein a MIM capacitor is formed by the first region of the first metal layer, the stop layer and the filled first opening, and the filled second opening forms a via between the first and second metal layers.

In the advanced CMOS process, there are typically several metal layers. By repeating the above process for multiple layers, a stacked MIM capacitance can form to achieve high density (that is, with high capacitance per unit area.)

These and other objects, advantages and features will become readily apparent in view of the following detailed description of the invention.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

FIGS. 16A-J, 17A-J, 18A-J and 19A-J illustrate four examples of metal capacitors, according to the present invention.

DETAILED DESCRIPTION OF THE PREFERRED EMBODIMENTS

Overview

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially orthogonal to the surface of a substrate.

Method

In a dual-damascene process, there is usually a dielectric layer on top of the metal, which is used as an etch stopping layer for the via etch. This layer is always removed in the subsequent metal trench etch. However, the inventor has discovered that by violating the design by drawing a via layer without a metal layer on top of it, this etch stopping layer can be used as the field dielectic between the bottom metal and the via layer to form a MIM capacitor.

In a "via-first" dual-damascene process (such as case in the TSMC 0.13 µm process; for more information contact TSMC North America, 2585 Junction Avenue, San Jose, Calif. 95134 USA), a via/metal definition to form a MIM copper capacitor according to the present invention can be achieved by the following process steps.

Figure 1:
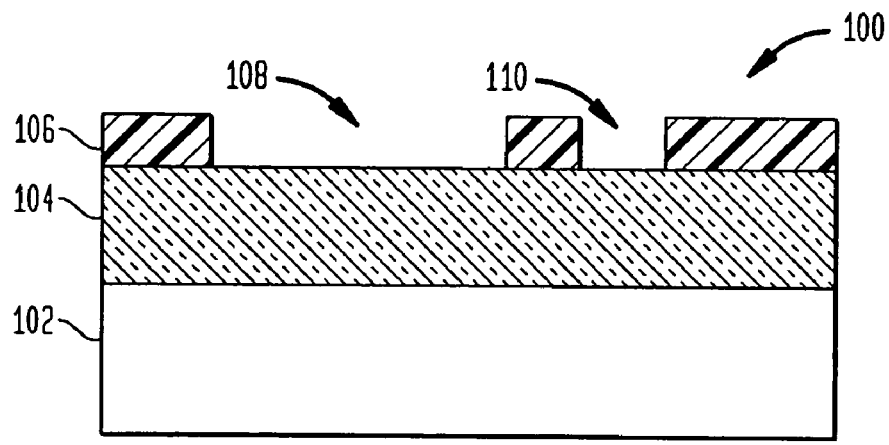
FIGS. 1-15 illustrate a process for making a metal-insulator-metal capacitor, according to the present invention.

FIG. 1 illustrates a device 100, having a substrate 102, typically comprised of silicon. Substrate 102 can have formed therein a plethora of microelectronic or microme-chanical structures, as would become apparent to a person skilled in the semiconductor art. A first dielectric layer 104 is formed on substrate 102 in a convention manner, such as oxidation, deposition, or the like processes. In a preferred embodiment, first dielectric layer 104 comprises silicon dioxide ($SiO_2$), but other dielectric material are substitutable, as would also become apparent to a person skilled in the semiconductor art. A mask layer 106 (e.g., photoresist or simply "resist") is formed on first dielectric layer 104, and is patterned according to know photolithographic techniques to form exposed areas 108 and 110. Mask layer 106 is also referred to as a patterned masking layer or a first patterned masking layer.

Figure 2:
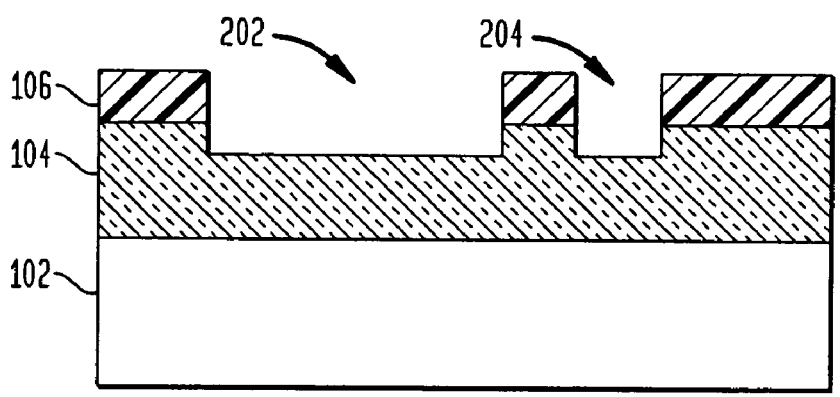
Figure 3:
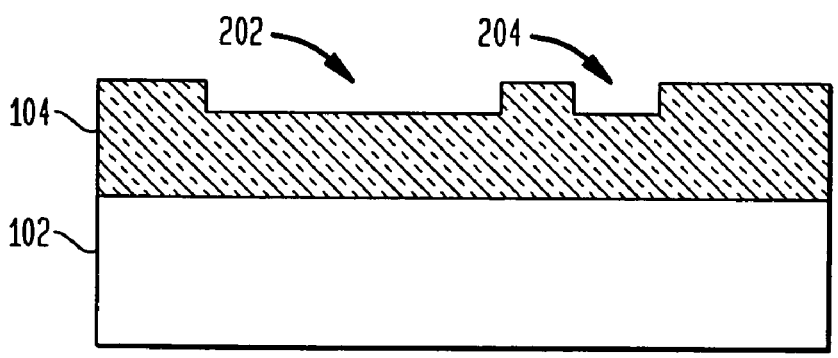
Figure 4:
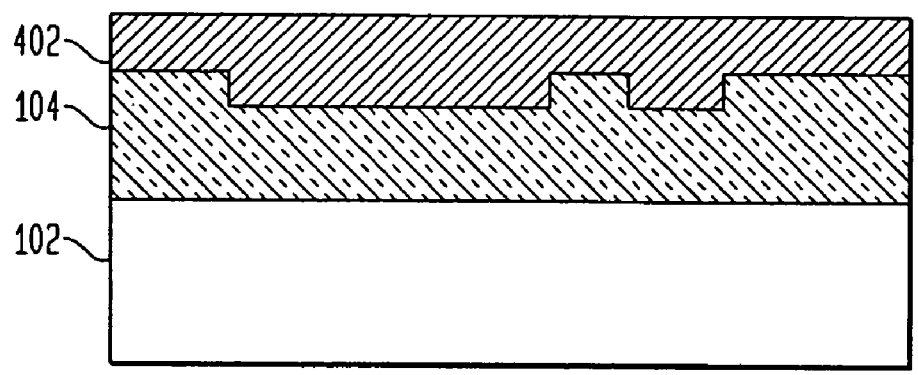
Figure 5:
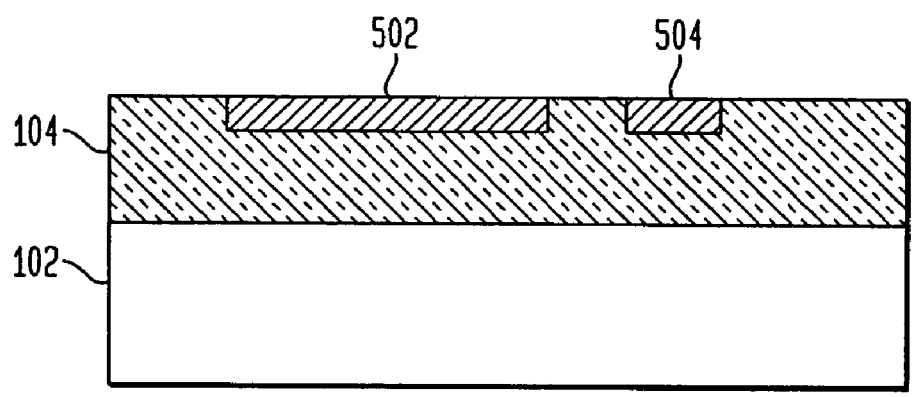

Trenches 202 and 204 in the first dielectric layer 104 are then chemically etched at areas 108 and 110, resulting is the structure illustrated in FIG. 2. Then mask layer 106 is removed by known techniques, as illustrated in FIG. 3. Copper or a copper alloy 402 is flowed over the substrate to fill trenches 202 and 204, as illustrated in FIG. 4. Deposition or other known techniques can be used. Excess metal is removed by chemical metal polishing (CMP), or other know techniques, as illustrated in FIG. 5. Thus, FIG. 5 shows a first metal layer formed in the first dielectric layer 104, including a first region 502 and a second region 504. In another embodiment a barrier metal, such as titanium nitride (TiN), can be formed beneath the copper/copper alloy is desired, as would be apparent to a person skilled in the relevant art.

Figure 6:
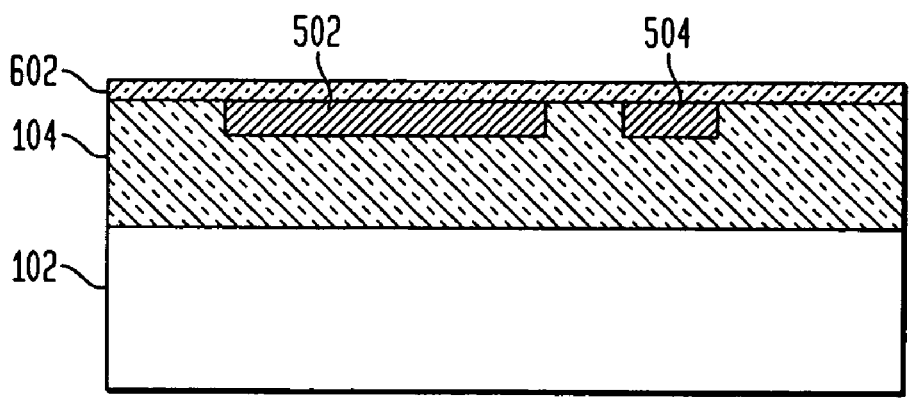
Figure 7:
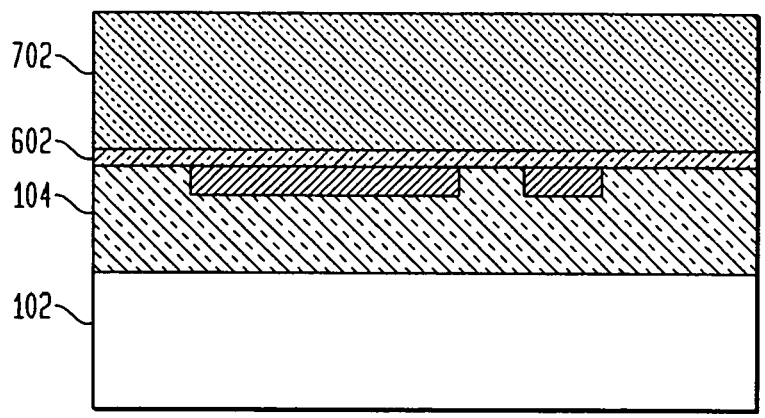

The formation of etch stopping layer 602, is followed by the formation of a second dielectric layer 702, as illustrated at FIGS. 6 and 7, respectively. In a preferred embodiment, second dielectric layer 702 (also called an inter-metal dielectric) comprises $SiO_2$, but other low-k dielectric material are substitutable, as would become apparent to a person skilled in the relevant art. Etch stop layer 602 preferably comprises silicon nitride (SiN), but other suitable etch stop layers are substitutable. Etch stop layer 602 is used to prevent copper of the previous metal (the first metal layer "M1") from exposure to the resist strip chemicals during subsequent processing to be described below. The following drawings shows cross-sectional views of the interconnect layers after a via etch and strip process. Deposition or other known techniques can be used to form layers 602 and 702.

Figure 8:
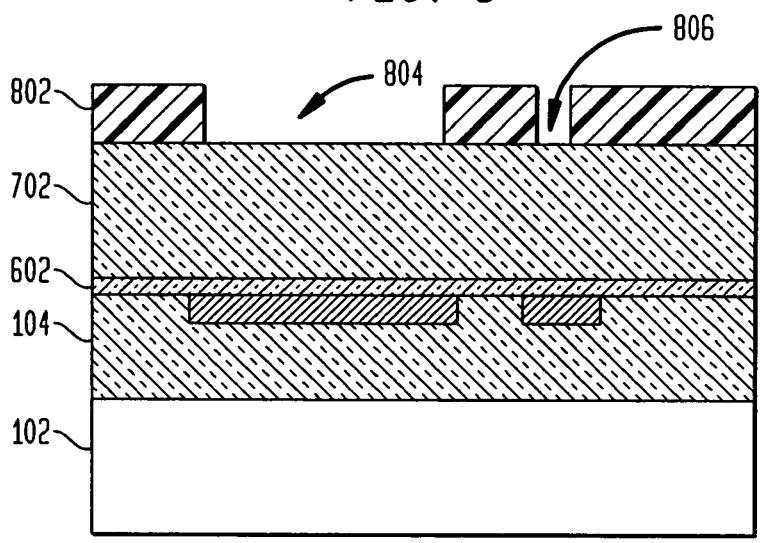
Figure 9:
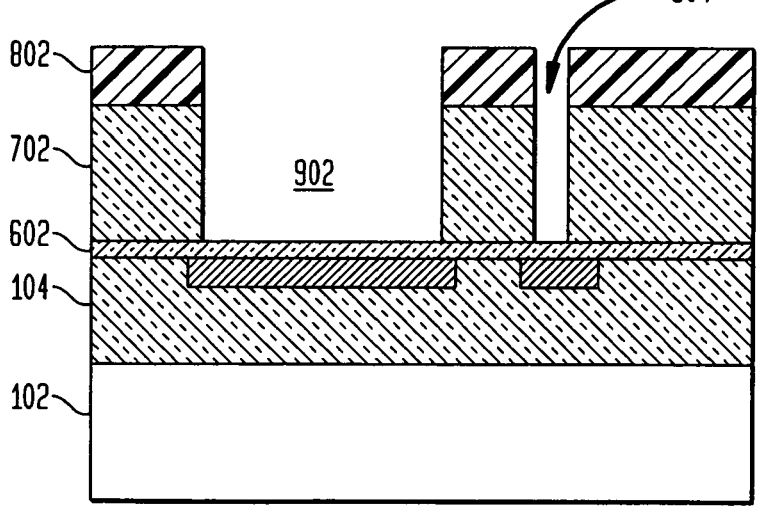
Figure 10:
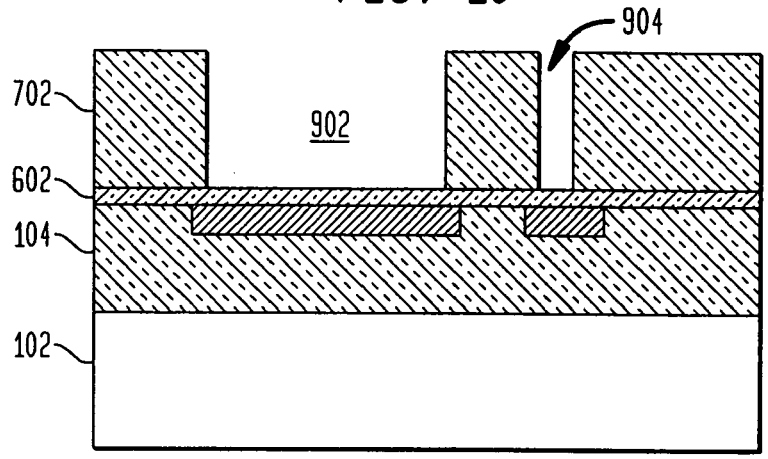

FIG. 8 illustrates a another mask layer 802 formed on the second dielectric layer 702. Mask layer 802 is also referred to as a resist, patterned masking layer or a second patterned masking layer. Mask layer 802 is patterned according to know photolithographic techniques to exposed areas 804 and 806 of the second dielectric layer 702, which are located above the first metal regions 502 and 504, respectively. The second dielectric layer 702 is chemically etched, or the like, using mask layer 802 to form holes 902 and 904, as illustrated in FIG. 9. Etch stop layer 602 prevents the resist strip chemicals from etching the first metal layer (i.e., regions 502 and 504). Mask 802 is then removed using know techniques, as illustrated in FIG. 10. According to the present invention, hole 902 will eventually be filled to form an upper plate of the MIM capacitor. Hole 904 will be filled to form a "via" for electrically coupling the first metal layer with a second metal layer.

Figure 11:
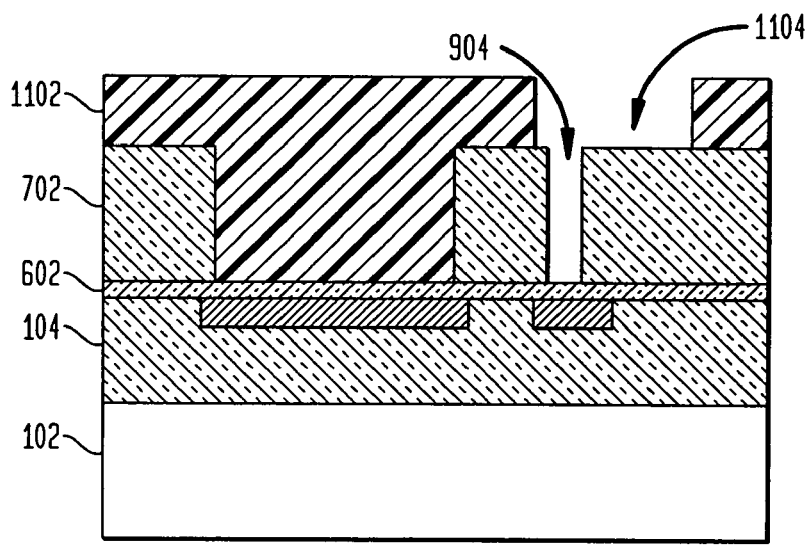
Figure 12:
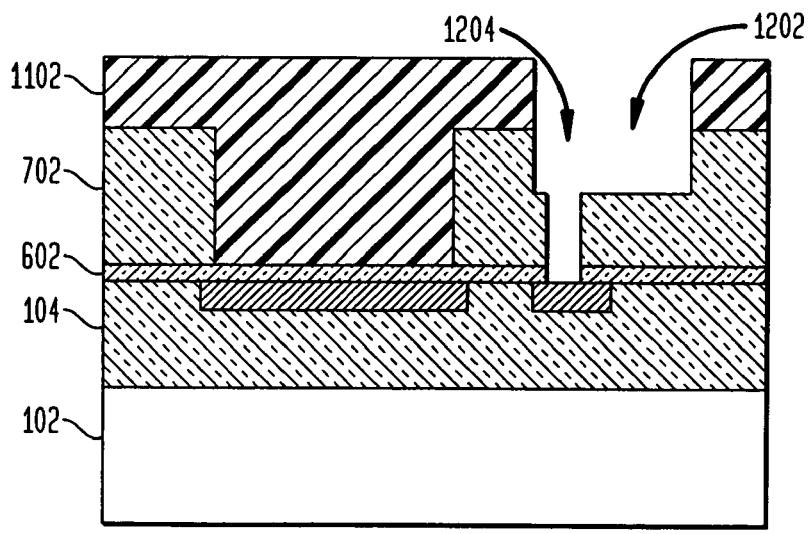
Figure 13:
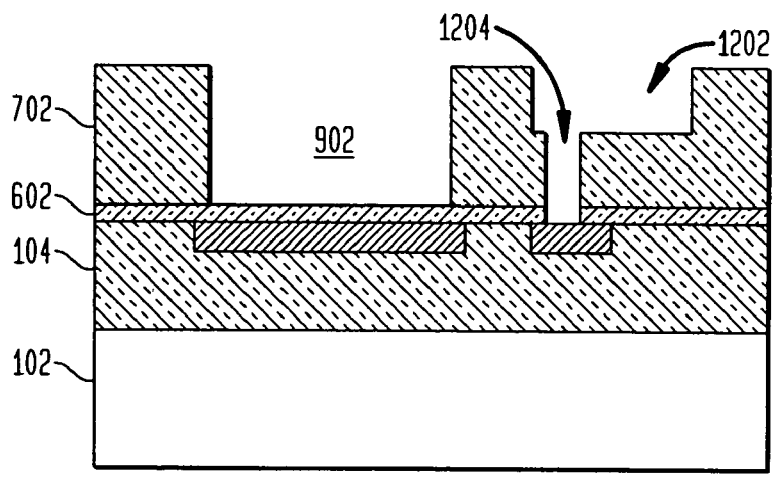

FIG. 11 illustrates the application of yet another mask layer 1102. Mask layer 1102 is also referred to as a resist, patterned masking layer or a third patterned masking layer. Mask layer 1102 is patterned at region 1104 so as to leave a portion of the second dielectric layer 702 and hole 904 exposed, but hole 902 is filled. After chemically etching, or the like, using mask layer 1102, an additional trench 1202 of the second dielectric layer 702 is removed, as illustrated in FIG. 12. FIG. 12 also illustrates that a hole 1204 of the etch stop layer 602 is removed from the bottom of the via (hole 904) by the process. However, the portion of the etch stop layer 602 associated with hole 902 remains to form the insulator portion of the MIM capacitor according to the present invention. Mask layer 1102 is removed, as illustrated at FIG. 13, thereby re-exposing etch stop layer 602 at he bottom of hole 902.

Figure 14:
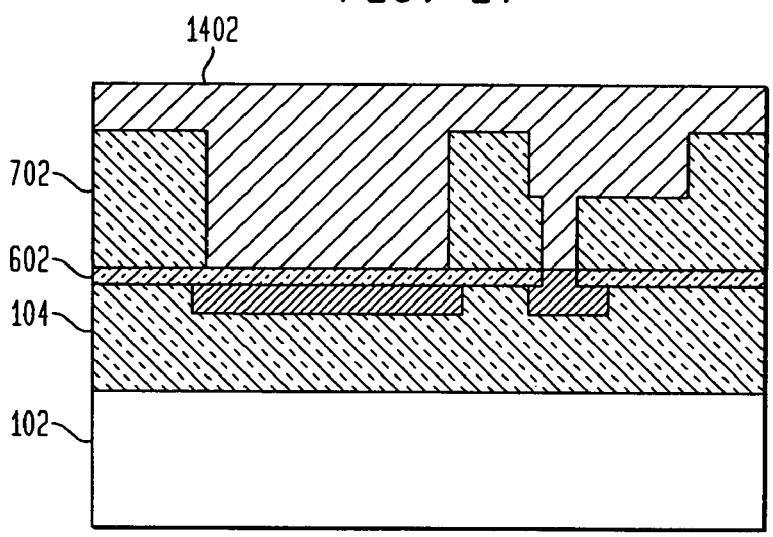
Figure 15:
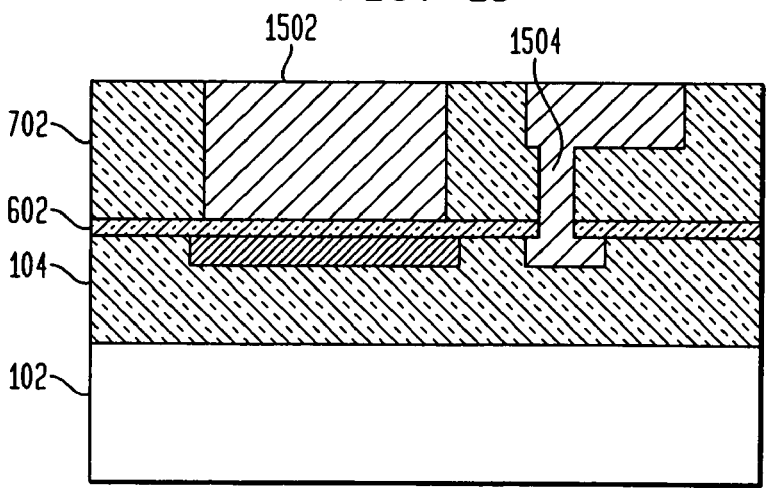

FIG. 14 illustrates the flowing of a second (copper or copper alloy) metal layer 1402 (also called "M2"). FIG. 15 illustrates CMP (or the like) of the second metal layer completes an upper plate 1502 of the MIM capacitor. A filled via 1504 is also formed as part of the second metal layer. In another embodiment a barrier metal, such as titanium nitride (TiN), can be formed beneath the copper/copper alloy is desired, as would be apparent to a persona skilled in the semiconductor art.

Structure

Four examples of metal capacitors according to the present invention, using the SiN etch stopping layers as the dielectric, are illustrated in FIGS. 16, 17, 18 and 19. For simplicity, only five (5) via fingers per electrode are shown in each case. In reality, the structure can be much larger for higher capacitance value. Also in each case, the entire electrode number 2 is caged in electrode number 1 (which is usually grounded) for noise isolation. Although the capacitors are square, any convenient topology can be implemented without departing from the spirit and scope of the invention.

Figure 16A:
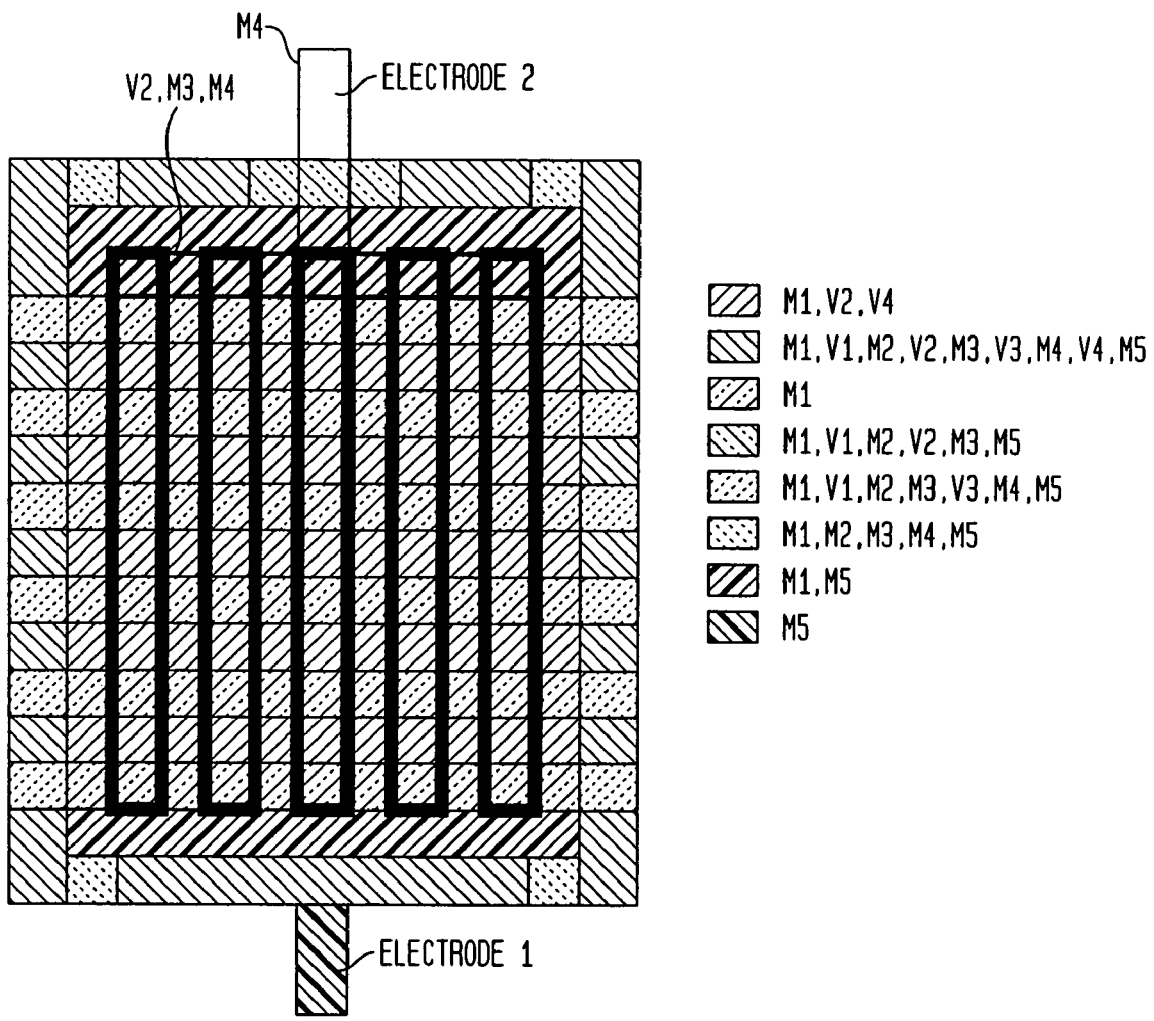

In the first example of FIG. 16, the two electrodes are perpendicular to each other, which makes the absolute value of the capacitance least sensitive the photo mis-alignments. FIG. 16A illustrates five (5) mask layers and four (4) via layers, as shown in the Key. Those layers are further illustrated in FIGS. 16B-J, respectively.

Figure 17A:
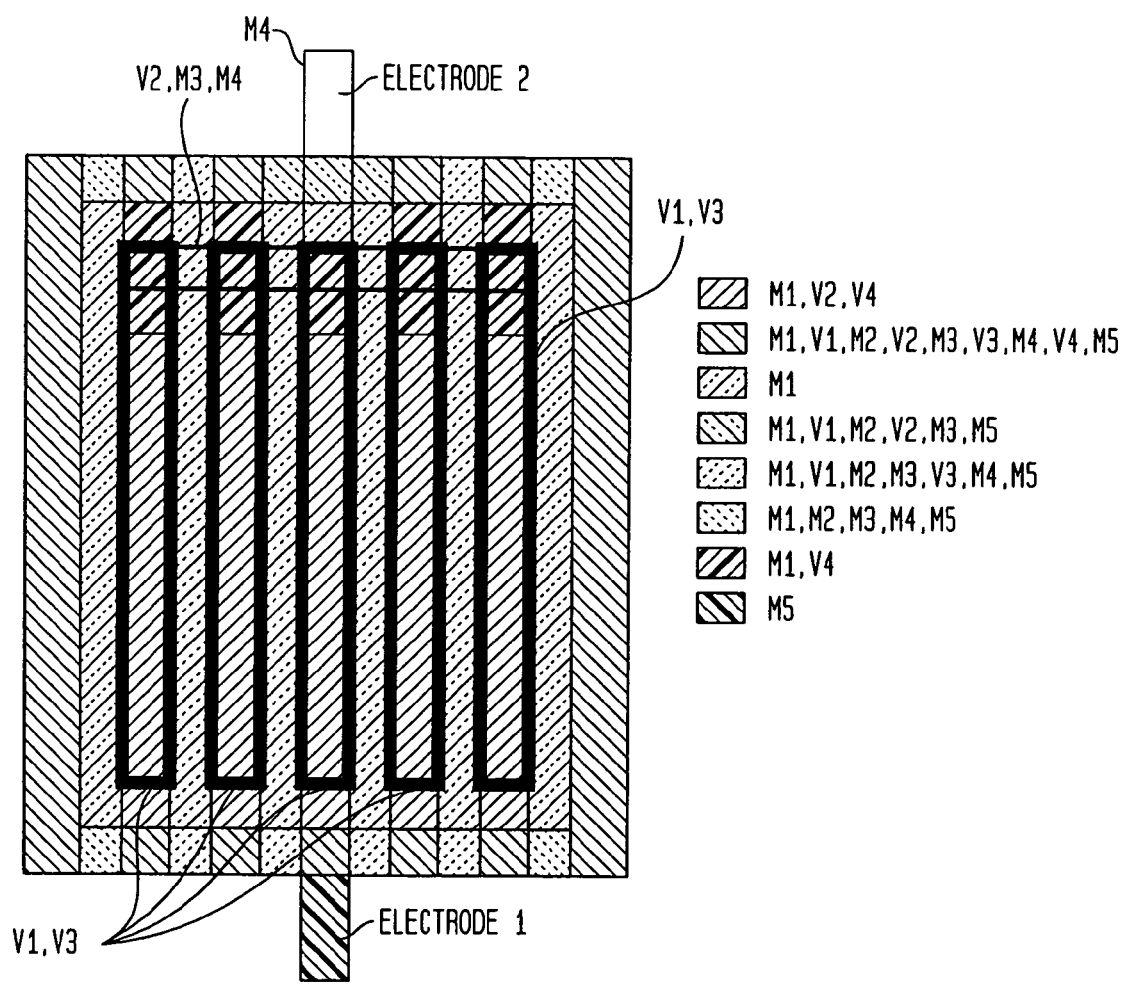

In the second example of FIG. 17, the capacitance value is about twice of that in the first case in FIG. 16. The second example can be used when the circuit is not sensitive to the absolute value of the total capacitance, but the matching of two capacitors in the same die is desired. FIG. 17A also illustrates five (5) mask layers and four (4) via layers, as shown in the Key. Those layers are further illustrated in FIGS. 17B-J, respectively.

Figure 18A:
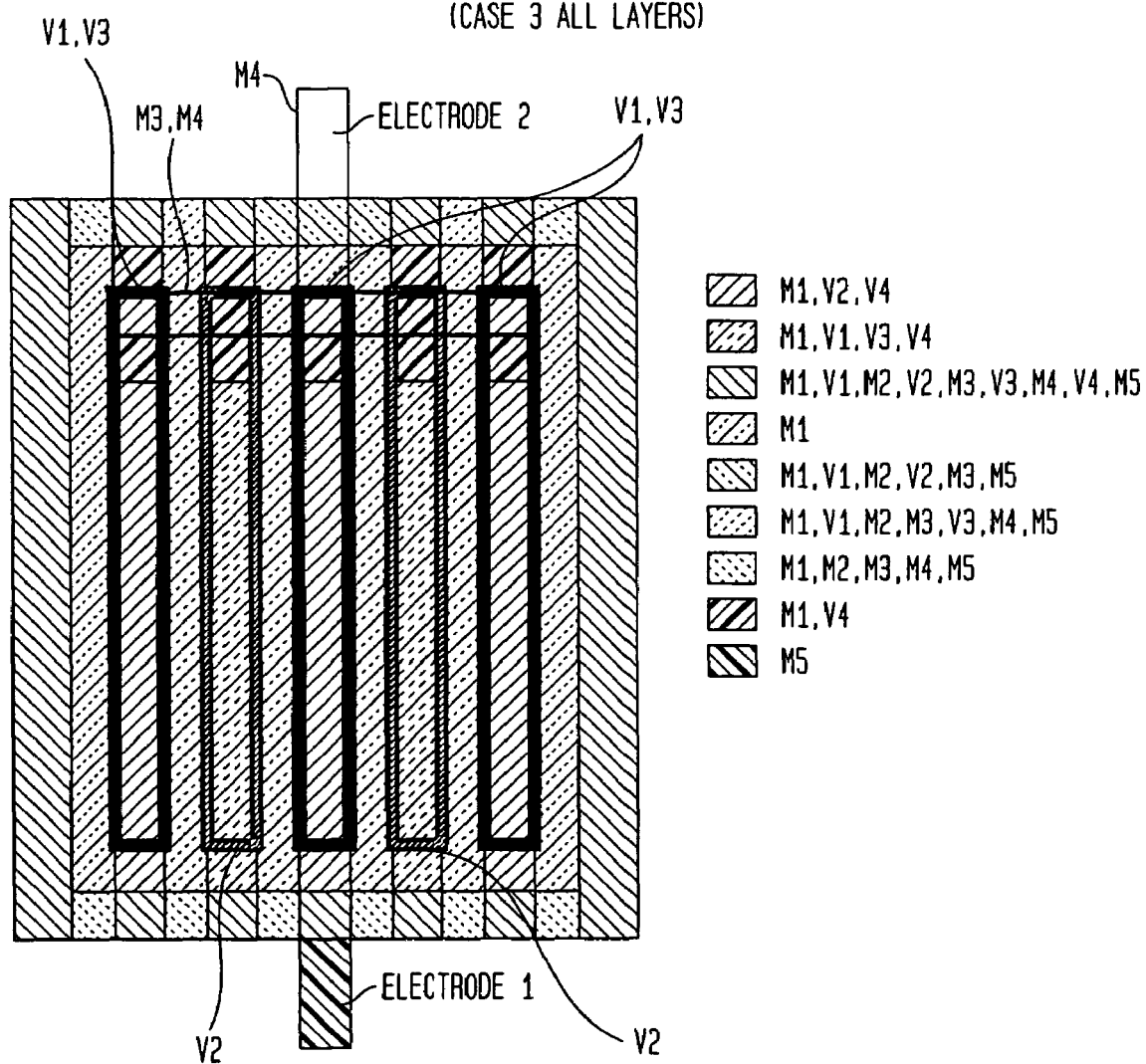

In the third example of FIG. 18, the capacitance value can be even larger than the second example due to the extra intra-layer metal coupling. Like the second case, these type of capacitors are sensitive to photo misalignment and can be used when the capacitance matching is desired. FIG. 18A also illustrates five (5) mask layers and four (4) via layers, as shown in the Key. Those layers are further illustrated in FIGS. 18B-J, respectively.

Figure 19A:
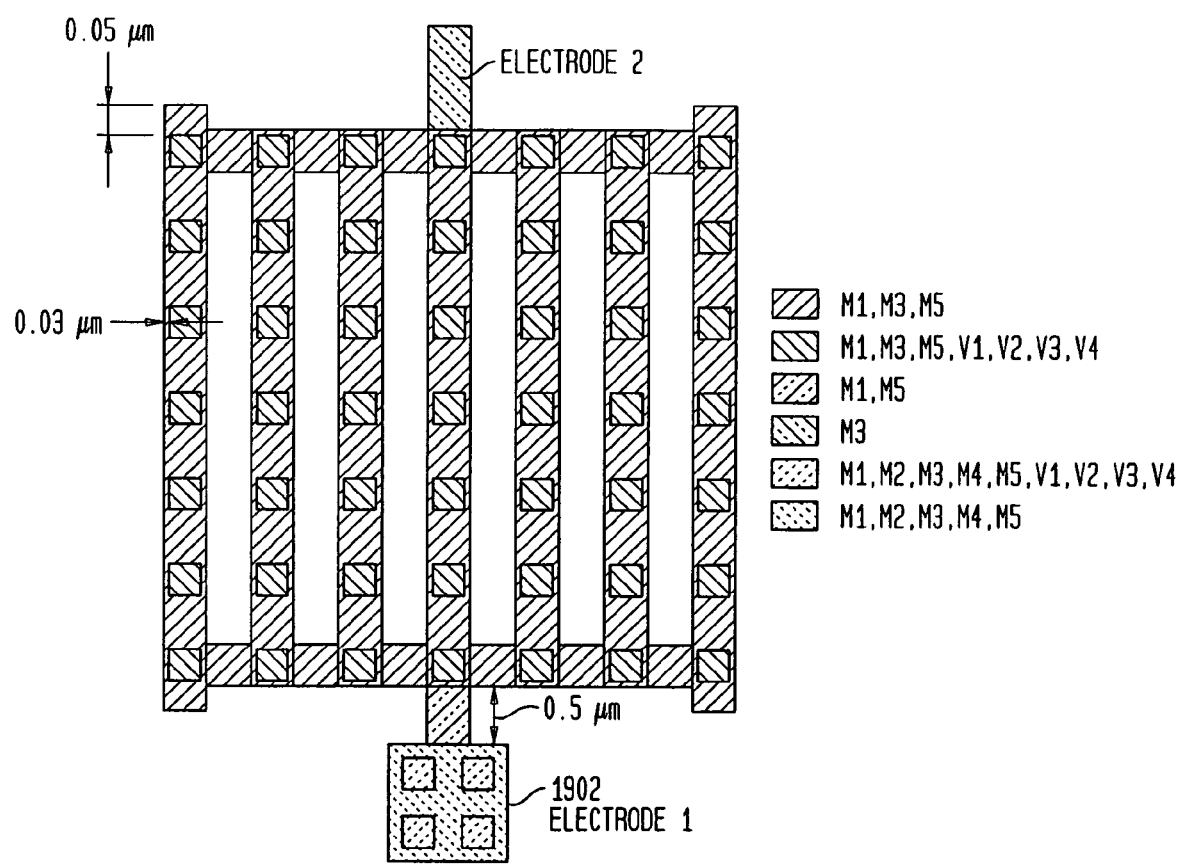

In the fourth example of FIG. 19, a 25×25 array has 25 fingers. Electrode 1 at 1902 is to connect the M1 electrode to the M5 electrode. The size/space for the 4 vias at 1902 is 0.19 µm/0.22 µm, for example. The size of this metal is 0.7×0.7 µm. FIG. 19A also illustrates five (5) mask layers and four (4) via layers, as shown in the Key. Those layers are further illustrated in FIGS. 19B-J, respectively.

CONCLUSION

An advantage of the present invention is the ability to manufacture mixed-signal products by using standard CMOS logic process for lower wafer cost and shorter process time. Reduction in the capacitor area with good yield means reduction in the wafer cost. Accordingly, the present invention provides very high density capacitors for today's most advanced copper interconnect processes.

The present invention may be implemented with various changes and substitutions to the illustrated embodiments. For example, the present invention may be implemented on substrates comprised of materials other that silicon, such as, for example, gallium arsenide or sapphire. Additionally, illustrative embodiments describe vias between two levels of interconnect, however those skilled in the art will recognize that many interconnect levels may be formed in accordance with the present invention.

It will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A metal-insulator-metal (MIM) capacitor, comprising:
   a first metal layer comprising copper or copper alloy directly in contact with a dielectric layer, wherein a portion of the first metal layer is utilized as a lower plate of the MIM capacitor;
   an etch stop layer directly in contact with dielectric layer and directly on the first metal layer, wherein a portion of the etch stop layer is utilized as an insulator for the MIM capacitor; and
   a second metal layer comprising copper or copper alloy directly in contact with a portion of the etch stop layer, wherein a portion of the second metal layer is utilized as an upper plate of the MIM capacitor.

2. The MIM capacitor according to claim 1, wherein the stop layer includes a silicon nitride layer.

3. The MIM capacitor according to claim 1, wherein the second metal layer comprises a chemical-mechanical polished surface.

4. The MIM capacitor according to claim 1, wherein the first metal layer comprises a chemical-mechanical polished surface.

5. A metal-insulator-metal (MIM) capacitor, comprising:
   a first dielectric layer directly in contact with a substrate;
   a first metal layer made from copper and directly in contact with the first dielectric layer;
   a stop layer directly in contact with the first dielectric layer;
   a second dielectric layer directly in contact with the stop layer;
   a first opening and a second opening in the second dielectric layer that expose portions of the stop layer above a first region and a second region of the first metal layer;
   a third opening adjacent the second opening in the second dielectric layer; and
   a second metal layer made from copper in the first, second, and third openings over the substrate,
   wherein the metal-insulator-metal (MIM) capacitor comprises the first region of the first metal layer, the stop layer, and the filled first opening, and
   wherein the filled second opening is a via between the first and second metal layers.

6. The MIM capacitor of claim 5, wherein the first dielectric layer includes a silicon oxide layer.

7. The MIM capacitor of claim 5, wherein the stop layer includes a silicon nitride layer.

8. The MIM capacitor of claim 5, wherein the second dielectric layer includes a silicon oxide layer.

9. The MIM capacitor of claim 5, wherein the second metal layer comprises chemical-mechanical polished surface.

10. The MIM capacitor of claim 5, wherein the first metal layer comprises chemical-mechanical polished surface.

11. The MIM capacitor of claim 5, wherein the first and second dielectric layers are thicker than the stop layer.

12. A metal-insulator-metal (MIM) capacitor, comprising:
   a first dielectric layer directly in contact with a substrate, the first dielectric layer having a removed depth-wise portion filled with a copper or copper alloy, thereby forming a first metal layer;
   a stop layer directly in contact with the first dielectric layer and the first metal layer; and
   a second dielectric layer directly in contact with the stop layer, the second dielectric layer having a first opening and a second opening that expose portions of the stop layer above a first region and a second region of the first metal layer, respectively, wherein the first and second openings are filled with a copper or copper alloy, thereby forming a second metal layer;
   wherein a metal-insulator-metal (MIM) capacitor is by the first region of the first metal layer, the stop layer, and the filled first opening, and
   wherein the filled second opening is a via between the first and second metal layers.

13. The MIM capacitor of claim 12, wherein the first dielectric layer includes a silicon oxide layer.

14. The MIM capacitor of claim 12, wherein the stop layer includes a silicon nitride layer.

15. The MIM capacitor of claim 12, wherein the second dielectric layer includes a silicon oxide layer.

16. The MIM capacitor of claim 12, wherein the second metal layer comprises chemical-mechanical polished surface.

17. The MIM capacitor of claim 12, wherein said first metal layer comprises chemical-mechanical polished surface.

18. The MIM capacitor of claim 12, wherein the first and second dielectric layers are thicker than the stop layer.

* * * * *

UNITED STATES PATENT AND TRADEMARK OFFICE
CERTIFICATE OF CORRECTION

PATENT NO. : 7,329,955 B2  Page 1 of 1
APPLICATION NO. : 11/365922
DATED : February 12, 2008
INVENTOR(S) : Liming Tsau It is certified that error appears in the above-identified patent and that said Letters Patent is hereby corrected as shown below:

Title Page
Item (75), Inventors, "Irvine, CA (US)" replace with --Irvine, CA (TW)--.

Signed and Sealed this

Tenth Day of June, 2008

JON W. DUDAS
*Director of the United States Patent and Trademark Office*